US010429455B2

(12) United States Patent
Shoji et al.

(10) Patent No.: US 10,429,455 B2
(45) Date of Patent: Oct. 1, 2019

(54) HALL ELEMENT AND METHOD OF MANUFACTURING HALL ELEMENT

(71) Applicant: ASAHI KASEI MICRODEVICES CORPORATION, Tokyo (JP)

(72) Inventors: Tomoya Shoji, Tokyo (JP); Tetsuya Takahashi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 28 days.

(21) Appl. No.: 15/928,380

(22) Filed: Mar. 22, 2018

(65) Prior Publication Data
US 2018/0275213 A1    Sep. 27, 2018

(30) Foreign Application Priority Data

Mar. 23, 2017  (JP) ................................. 2017-058193

(51) Int. Cl.
*G01R 33/07*    (2006.01)
*G01R 33/09*    (2006.01)

(52) U.S. Cl.
CPC ........... *G01R 33/07* (2013.01); *G01R 33/075* (2013.01); *G01R 33/093* (2013.01)

(58) Field of Classification Search
CPC ..... G01R 33/07; G01R 33/075; G01R 33/093
USPC ........ 324/200, 207.2–207.22, 219, 244–250, 324/436, 500, 529, 750.12, 750.21, 324/754.17, 754.29, 631, 251, 166, 160, 324/600, 167, 76.11, 117 H, 144–151 A; 257/421–427, 536
See application file for complete search history.

(56) References Cited

U.S. PATENT DOCUMENTS

| 3,522,494 A | 8/1970 | Bosch | |
| 4,123,772 A * | 10/1978 | Janssen | ................. H01L 43/065 257/427 |
| 2002/0160548 A1* | 10/2002 | Fukunaka | .............. G01R 33/09 438/48 |
| 2017/0062703 A1 | 3/2017 | Nakagawa et al. | |

FOREIGN PATENT DOCUMENTS

| JP | S60-175471 A | 9/1985 |
| JP | S62-012974 U1 | 1/1987 |
| JP | H03-211778 A | 9/1991 |
| JP | 2017-076749 A | 4/2017 |

* cited by examiner

*Primary Examiner* — Melissa J Koval
*Assistant Examiner* — Trung Nguyen
(74) *Attorney, Agent, or Firm* — Morgan, Lewis & Bockius LLP

(57) ABSTRACT

A hall element is provided to suppress variations in a hall output voltage of the hall element due to a stacked structure of an electrode portion, an insulating film, and a magnetosensitive portion. The hall element may include a substrate, a magnetosensitive portion formed on the substrate, an insulating film formed on the magnetosensitive portion, electrode portions formed on the insulating film, and contact portions electrically connecting the electrode portions and the magnetosensitive portion to each other through the insulating film, in which the entire region surrounded by the contact portions is included in the region of the magnetosensitive portion, and the proportion of regions extending with the corresponding contact portions of the electrode portions as reference points is set to be equal to or less than a predetermined value in a quadrangle formed by the region surrounded by the contact portions.

6 Claims, 5 Drawing Sheets

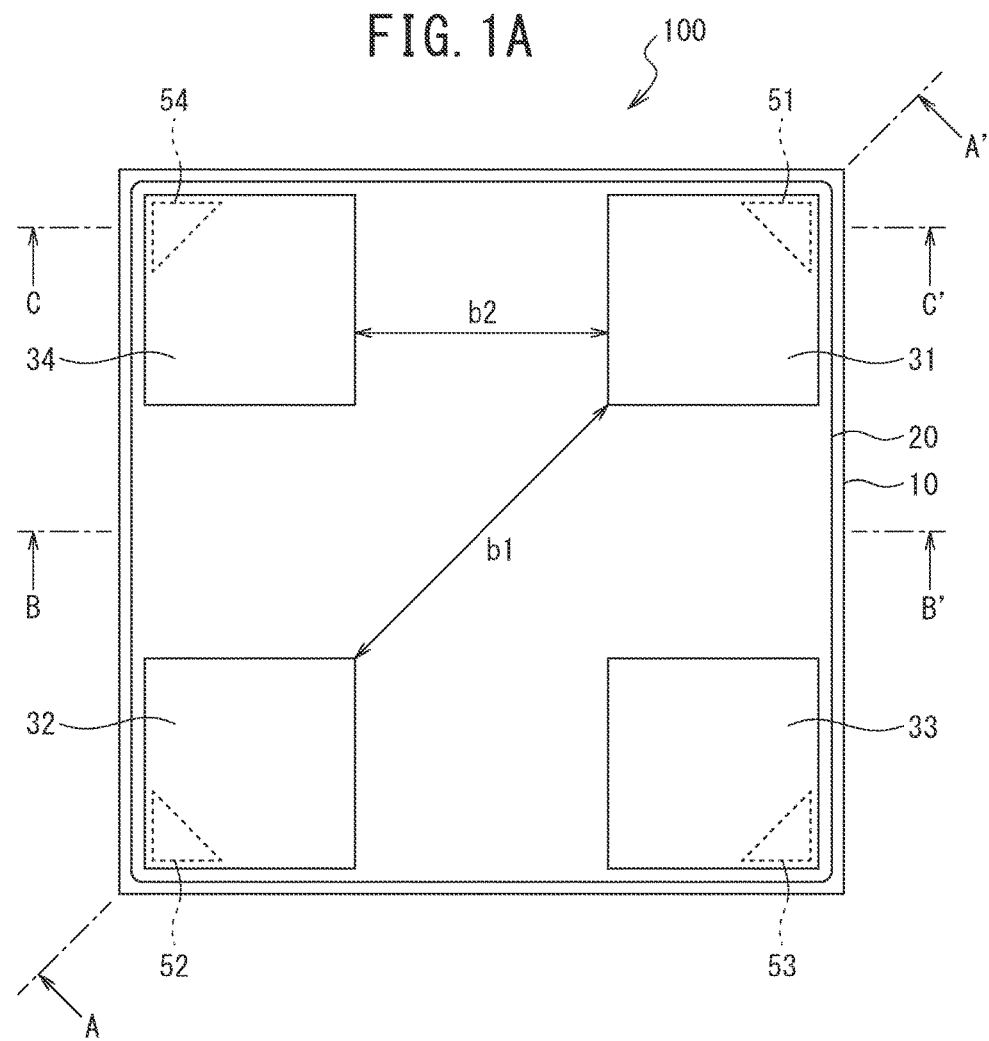
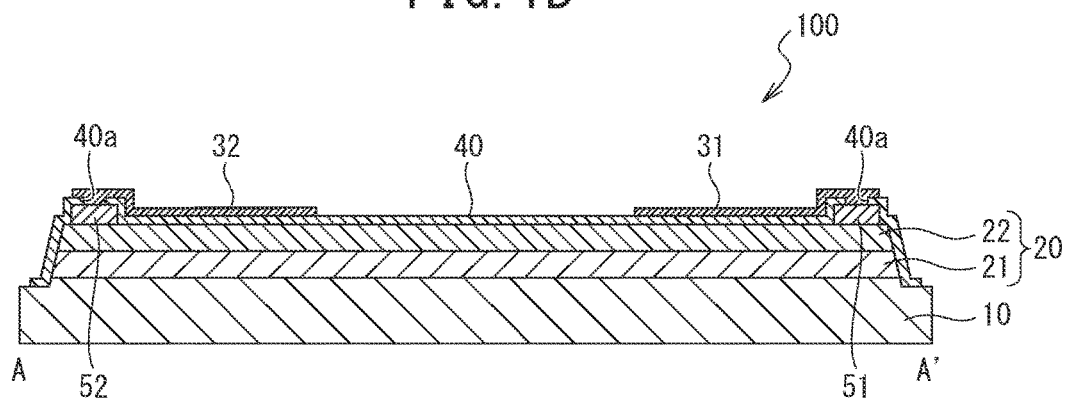

HALL ELEMENT AND METHOD OF MANUFACTURING HALL ELEMENT

BACKGROUND OF THE INVENTION

Field of the Invention

The present invention relates to a hall element and a method of manufacturing the hall element.

Description of the Related Art

In recent years, a hall element including a contact for connecting a magnetosensitive portion and an electrode pad to each other has been known (see for example, PTL 1 and PTL 2).

CITATION LIST

Patent Literature

PTL 1: JP 60-175471 A
PTL 2: JP 62-12974 A

SUMMARY OF THE INVENTION

In a hall element of the related art, an insulating film is formed on a magnetosensitive portion, and the magnetosensitive portion and an electrode pad are electrically connected to each other via a contact through an opening formed in the insulating film. For this reason, a stacked structure of the electrode pad, the insulating film, and the magnetosensitive portion is formed on a substrate, and there is a possibility that parasitic capacitance is generated. In addition, as the area of the stacked structure when seen in a top view increases, a potential difference to be applied to the insulating film is increased. As a result, there is a possibility that fluctuation occurs in a hall output voltage of the hall element due to the generation of a leakage current, and the like.

Consequently, the invention is contrived in view of unsolved problems of the related art, and an object thereof is to provide a hall element and a method of manufacturing the hall element which are capable of suppressing fluctuation in a hall output voltage of the hall element due to a stacked structure of an electrode pad, an insulating film, and a magnetosensitive portion.

In order to accomplish the above-described object, according to an aspect of the invention, there is provided a hall element including a substrate, a magnetosensitive portion formed on the substrate, an insulating film formed on the magnetosensitive portion, and four conductive portions electrically connected to the magnetosensitive portion on the insulating film through the insulating film, in which each of the conductive portions includes an electrode portion formed on the insulating film so as to extend in a direction in which the conductive portions are close to each other, and a contact portion that electrically connects the electrode portion and the magnetosensitive portion to each other through the insulating film, in which the entire region surrounded by the four contact portions is included in the magnetosensitive portion, in which a first ratio r1 and a second ratio r2 which are defined by the following expressions are equal to or less than 75% when a distance between two points for minimizing a distance between the contact portions included in a conductive portion pair positioned on a diagonal line of a quadrangle formed by the region surrounded by the four contact portions is set to be a1, a distance between two points for minimizing a distance between the electrode portions included in the conductive portion pair positioned on the diagonal line is set to be b1, a distance between two points for minimizing a distance between the contact portions included in the adjacent conductive portion pairs on the same side of the quadrangle is set to be a2, and a distance between two points for minimizing a distance between the electrode portions included in the adjacent conductive portion pairs is set to be b2.

$$r1=(a1-b1)/a1$$

$$r2=(a2-b2)/a2$$

In addition, according to another aspect of the invention, there is provided a method of manufacturing a hall element including a substrate, a magnetosensitive portion formed on the substrate, an insulating film formed on the magnetosensitive portion, and four conductive portions disposed on the insulating film at positions serving as corner portions of a quadrangle and electrically connected to the magnetosensitive portion through the insulating film, each of the conductive portions including an electrode portion formed on the insulating film so as to extend in a direction in which the conductive portions approach each other, and a contact portion that electrically connects the electrode portion and the magnetosensitive portion to each other through the insulating film, a region of the quadrangle with the four conductive portions as the corner portions being included in a region of the magnetosensitive portion when seen in a top view, the method including determining a target value of a ratio between the conductive portions for making variations in characteristics of the hall element equal to or less than the target value, with proportions of a distance between points for minimizing a distance between the contact portions included in a conductive portion pair, including two of the four conductive portions, and a distance between points for minimizing a distance between the electrode portions included in the conductive portion pair, as the ratio between the conductive portions, determining a shape of the magnetosensitive portion, determining positions where the contact portions are disposed, and shapes of the contact portions, and determining positions where the electrode portions are disposed, and shapes of the electrode portions to satisfy the target value of the ratios between the conductive portions, on the basis of the positions where the contact portions are disposed, and the shapes of the contact portions.

According to an aspect of the invention, it is possible to suppress fluctuation in a hall output voltage of a hall element.

BRIEF DESCRIPTION OF DRAWINGS

FIG. 1A is a top view illustrating an example of a hall element according to an embodiment of the invention.

FIG. 1B is a cross-sectional view taken along line A-A' of FIG. 1A.

DESCRIPTION OF THE PREFERRED EMBODIMENTS

Figure 1C:
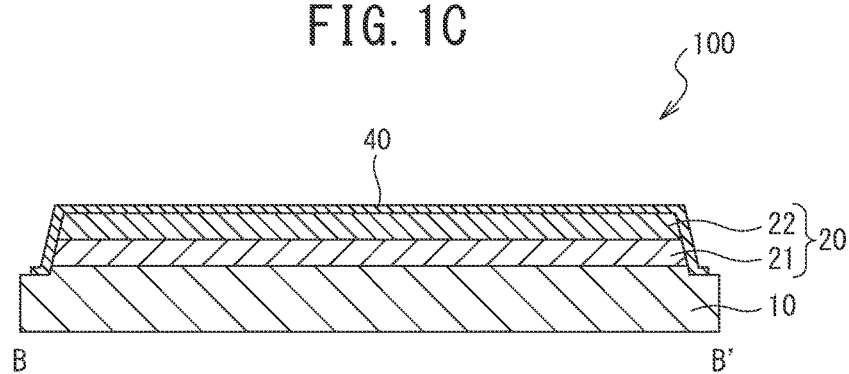
FIG. 1C is a cross-sectional view taken along line B-B' of FIG. 1A.

In the following detailed description, many specific concrete configurations are described so as to provide the complete understanding of an embodiment of the invention. However, it is apparent that the invention is not limited to such specific concrete configurations, and other embodiments can be implemented. In addition, the following embodiment does not limit the invention according to claims, and includes all combinations of characteristic configurations described in the embodiment.

Hereinafter, an embodiment of the invention will be described with reference to the accompanying drawings. In the following description of the drawings, the same portions are denoted by the same reference numerals and signs. However, the drawings are schematic drawings, and a relationship between a thickness and a planar dimension, a thickness ratio in layers, and the like are different from those in real life.

Embodiment

FIG. 1A is a top view illustrating an example of a hall element 100 according to an embodiment of the invention. FIG. 1B is a cross-sectional view taken along line A-A' of FIG. 1A. FIG. 1C is a cross-sectional view taken along line B-B' of FIG. 1A.

The hall element 100 according to the embodiment of the invention includes a substrate 10, a magnetosensitive portion 20, electrode portions 31 to 34, an insulating film 40, and contact portions 51 to 54. The magnetosensitive portion 20 includes a conductive layer 21 and a surface layer 22. The electrode portions 31 to 34 and the contact portions 51 to 54 constitute a conductive portion.

The substrate 10 is a semiconductor substrate such as Si or a compound semiconductor. The substrate 10 according to the embodiment of the invention is, for example, a GaAs substrate. A specific resistance of the substrate (GaAs substrate) 10 is equal to or greater than $1.0 \times 10^5$ Ω·cm. An upper limit of the specific resistance of the substrate 10 may be equal to or less than $1.0 \times 10^9$ Ω·cm. The substrate 10 has, for example, substantially a square planar shape. Meanwhile, the planar shape of the substrate 10 is not limited to substantially a square shape and can be arbitrarily set. The substrate may have a planar shape which is similar to and larger than, for example, the planar shape of the magnetosensitive portion 20.

The magnetosensitive portion 20 is formed on the substrate 10. The magnetosensitive portion 20 may be formed on the substrate 10 so as to be partially embedded into the substrate 10. The magnetosensitive portion 20 has substantially a square planar shape. The magnetosensitive portion 20 is a layer having resistance lower than that of the substrate 10. The magnetosensitive portion 20 is formed of a compound semiconductor such as GaAs, InSb, and InAs. The magnetosensitive portion 20 according to the embodiment of the invention is formed of GaAs. In addition, the magnetosensitive portion 20 may be activated by injecting impurities, such as Si, Sn, S, Se, Te, Ge, and C, into the substrate 10 and heating the substrate. In addition, the magnetosensitive portion 20 may have a planar shape in which at least one corner thereof is rounded. A current flowing to the hall element 100 may be concentrated on an end of the magnetosensitive portion 20. The planar shape of the magnetosensitive portion 20 has a round portion, and thus the concentration of a current on the end of the magnetosensitive portion 20 is alleviated. Meanwhile, this effect becomes remarkable when the magnetosensitive portion 20 is formed on the substrate 10 in a step shape (mesa shape). Particularly, a corner portion of the magnetosensitive portion 20 has a radius of curvature equal to or higher than 10% with respect to the thickness of the magnetosensitive portion 20, and thus it is possible to alleviate the concentration of a current on the end of the magnetosensitive portion 20, which leads to a preferable effect. In addition, the corner portion has a radius of curvature equal to or less than 10000% with respect to the thickness of the magnetosensitive portion 20, and thus it is possible to suppress fluctuation in an output voltage of the hall element 100, which leads to a preferable effect. It is possible to reduce the exposure of a surface other than a surface (for example, a (100) surface) having the lowest dangling bond on the side surface of the magnetosensitive portion 20, and thus it is inferred that the surface recoupling of carriers hardly occurs.

Meanwhile, the magnetosensitive portion 20 is not limited to substantially a square shape. The entire region surrounded by the four contact portions 51 to 54 may be included in the magnetosensitive portion 20.

The magnetosensitive portion 20 is formed to have substantially a square shape or is formed to have a shape in which the entire region surrounded by the four contact portions 51 to 54 is included in the magnetosensitive portion 20, and thus the magnetosensitive portion can be formed to have a shape in which a current hardly concentrates. In addition, it is possible to maximize the area of the magnetosensitive portion 20 with respect to the substrate 10. Thereby, this is preferable in that it is possible to suppress 1/f noise and to suppress fluctuation in output characteristics of the hall element 100.

When the entire region surrounded by the four contact portions is included in the magnetosensitive portion 20, the magnetosensitive portion 20 may be expanded to the outside of the region surrounded by the four contact portions. For example, the edge portion of the magnetosensitive portion 20 may not be a straight line, and a notch or the like may be formed in the edge portion of the magnetosensitive portion 20. On the other hand, in a case where the notch formed in the edge portion of the magnetosensitive portion 20 is relatively large and the entire region surrounded by the four contact portions 51 to 54 is formed to have a shape not included in the magnetosensitive portion 20 (a so-called cross shape), a current is easily concentrated in the vicinity (that is, a cross intersection portion) of the notch. For this reason, 1/f noise may be increased.

The region surrounded by the four contact portions 51 to 54 can be determined as follows. First, the center of gravity of the magnetosensitive portion 20 when seen in a top view is set to be the center of the magnetosensitive portion 20. Next, a point at which a distance between the center of the magnetosensitive portion 20 and each of the contact portions 51 to 54 is minimized is drawn in each of the contact portions 51 to 54. A region formed by connecting the points to each other is set to be the region surrounded by the four contact portions 51 to 54. Meanwhile, in a case where each of the contact portions includes a plurality of points at which a distance from the center of the magnetosensitive portion 20 is minimized, a region formed by connecting all of the points to each other is set to be the region surrounded by the four contact portions 51 to 54. In a case where a contact portion used for neither input nor output is present, the above-described region may be determined without considering the contact portion.

Further, a "quadrangle formed by the region surrounded by the four contact portions 51 to 54" can be determined as follows. In a case where the region surrounded by the four contact portions 51 to 54 is determined as described above and each contact portion includes only one point at which a distance from the center of the magnetosensitive portion 20 is the shortest, the "quadrangle formed by the region surrounded by the four contact portions 51 to 54" is equivalent to the region surrounded by the four contact portions 51 to 54. In a case where the contact portion includes a plurality of points at which a distance from the center of the magnetosensitive portion 20 is the shortest, anyone of the plurality of points is selected for one contact portion, and a region surrounded by a line segment, which is formed by connecting a total of four points for the respective contact portions to each other, is determined to be the "quadrangle formed by the region surrounded by the four contact portions 51 to 54".

The conductive layer 21 is formed on the substrate 10. The conductive layer 21 according to the embodiment of the invention is n-type GaAs. The film thickness of the conductive layer 21 is not particularly limited. The film thickness of the conductive layer 21 according to the embodiment of the invention is equal to or greater than 50 nm and equal to or less than 2000 nm. The film thickness of the conductive layer 21 may be equal to or greater than 100 nm and equal to or less than 1000 nm.

The surface layer 22 is formed of a conductive material on the conductive layer 21. The surface layer 22 is constituted of high-resistance crystal, such as a GaAs layer, AlGaAs, or AlAs, which has a conductivity lower than that of the conductive layer 21. The film thickness of the surface layer 22 according to the embodiment of the invention is equal to or greater than 150 nm. The film thickness of the surface layer 22 may be equal to or greater than 200 nm. An upper limit of the film thickness of the surface layer 22 may be equal to or less than 800 nm or may be equal to or less than 600 nm. Meanwhile, the surface layer 22 may not be formed in the magnetosensitive portion 20.

The insulating film 40 is formed so as to cover the upper surface and side surface of the magnetosensitive portion 20. The insulating film 40 according to the embodiment of the invention is formed so as to cover the entire surface layer 22 and the entire side surface of a stacked body of the conductive layer 21 and the surface layer 22 and to be in contact with the upper surface of the substrate 10.

An opening 40a for contact is provided in the insulating film 40. The thickness of the insulating film 40 is, for example, equal to or greater than 100 nm, but is not limited thereto. The insulating film 40 is, for example, a silicon nitride film ($Si_3N_4$ film), a silicon oxide film ($SiO_2$ film), an alumina film ($Al_2O_3$), a polyimide film, or a multilayer film in which at least one of these films is stacked. Meanwhile, in the top view illustrated in FIG. 1A, the insulating film 40 is omitted for convenience of description.

The electrode portions 31 to 34 are formed on the insulating film 40. For example, the electrode portion 31 and the electrode portion 32 are electrode portions for input for applying a current to the magnetosensitive portion 20, and the electrode portion 33 and the electrode portion 34 are electrode portions for output for detecting a hall voltage of the magnetosensitive portion 20. Here, a description is given on the assumption that the electrode portion 31 and the electrode portion 32 are electrode portions for input, and the electrode portion 33 and the electrode portion 34 are electrode portions for output, but the electrode portions for input and the electrode portions for output may be switched with each other. In addition, the electrode portions for input and the electrode portions for output may be sequentially exchanged with each other to make the hall element 100 perform a spinning current operation. Meanwhile, the hall element 100 may include an electrode portion, in addition to the electrode portions 31 to 34.

The electrode portions 31 to 34 are electrically connected to the magnetosensitive portion 20 via the contact portions 51 to 54 through the opening 40a provided in the insulating film 40. The electrode portions 31 to 34 are formed of a conductive material such as a metal or polysilicon. The electrode portions 31 to 34 according to the embodiment of the invention contain gold as a main component.

The electrode portions 31 to 34 are formed on the respective contact portions 51 to 54. Since the contact portions 51 to 54 are disposed at positions which are vertexes of substantially a square shape as described later, the electrode portions 31 to 34 disposed on the contact portions 51 to 54 are also disposed at positions which are vertexes of substantially a square shape.

In addition, the electrode portions 31 to 34 are formed so as to extend in a direction toward the opposite electrode portions on a diagonal line and in a direction toward each of the adjacent electrode portions on both sides thereof when seen with the corresponding contact portions 51 to 54 as reference points. The electrode portions 31 to 34 according to the embodiment of the invention each have, for example, substantially a square planar shape, and the corner portion of each of the electrode portions 31 to 34 and the corner portion of the magnetosensitive portion 20 respectively have shapes similar to each other. Further, the electrode portions 31 to 34 and the magnetosensitive portion 20 are disposed so that the sides thereof are parallel to each other. In addition, the outer circumference of each of the electrode portions 31 to 34 is positioned on the inner side of a region surrounded by the outer circumference of the magnetosensitive portion 20 when seen in a top view. The sizes of the electrode portions 31 to 34 will be described later.

Here, in a case where the electrode portions 31 to 34 are formed in the upper portion of the magnetosensitive portion 20, the magnetosensitive portion 20 is configured such that at least one corner thereof is rounded, and thus it is possible to prevent the effects of chipping.

That is, dicing is performed when dividing the substrate 10 into individual pieces. However, in a case where the electrode portions 31 to 34 are not disposed between the outer circumferential portion of the substrate 10 and the outer circumferential portion of the magnetosensitive portion 20, the magnetosensitive portion 20 is broken due to chipping, and the concentration of a current due to the breakage may occur. Particularly, in a case where the corner of the magnetosensitive portion 20 is not rounded, stress from the insulating film 40 and stress during the dicing are concentrated on the corner of the magnetosensitive portion, and thus may become a starting point of a crack. In a case where at least one corner of the magnetosensitive portion 20 is rounded, the stress and the like are alleviated, and the breakage of the end of the magnetosensitive portion 20 due to chipping is suppressed, whereby it is possible to alleviate the concentration of a current.

Meanwhile, the electrode portions 31 to 34 according to the embodiment of the invention have the same planar shape, but may have different planar shapes. For example, the electrode portions for input and the electrode portions for output may be configured to have different planar shapes.

In addition, the electrode portions 31 to 34 according to the embodiment of the invention are formed within the region of the magnetosensitive portion 20 when seen in a top view, but at least a portion of the electrode portions may extend to the outside of the region of the magnetosensitive portion 20 when seen in a top view. Meanwhile, when the electrode portions 31 to 34 are formed within the region of the magnetosensitive portion 20 when seen in a top view, it is possible to reduce fluctuations in an output voltage of the hall element 100, which leads to a preferable effect. This is because stress due to a difference in thermal expansion coefficient between the magnetosensitive portion 20 and the electrode portions 31 to 34 is hardly applied to the magnetosensitive portion 20.

The contact portions 51 to 54 are formed on the magnetosensitive portion 20. The contact portions 51 to 54 according to the embodiment of the invention electrically connect the electrode portions 31 to 34 and the magnetosensitive portion 20 to each other through the insulating film 40. In the embodiment of the invention, the contact portions 51 to 54 are formed at positions which are vertexes of substantially a square shape. Meanwhile, the positions where the contact portions 51 to 54 are disposed are not limited to the positions which are vertexes of substantially a square shape, and may be positions which are vertexes of a quadrangle.

The electrode portions 31 to 34 are formed on the contact portions 51 to 54.

The contact portions 51 to 54 according to the embodiment of the invention are formed of, for example, the same materials as those of the electrode portions 31 to 34. The electrode portions 31 to 34 and the contact portions 51 to 54 may be integrally formed as conductive portions at the same time by the same process. Meanwhile, the contact portions 51 to 54 may be formed of materials different from those of the electrode portions 31 to 34.

Each of the contact portions 51 to 54 has a planar shape based on the planar shape of the magnetosensitive portion 20, and is formed to have such a size that the magnetosensitive portion 20 and each of the corresponding electrode portions 31 to 34 can be electrically connected to each other. The planar shape of each of the contact portions 51 to 54 is, for example, substantially a triangular shape similar to the corner portion of the magnetosensitive portion 20, and the contact portions 51 to 54 are formed such that three vertexes thereof vertically face a region outside the vertexes of the magnetosensitive portion 20 and two of three sides thereof are parallel to two sides of the magnetosensitive portion 20.

In addition, the planar shape of each of the contact portions 51 to 54 may have a rounded portion in at least a portion of the outer region corresponding to the outer circumferential side of the magnetosensitive portion 20. In addition, the planar shape of each of the contact portions 51 to 54 may have a rounded portion in the inner region on the central side of the magnetosensitive portion 20, and may have, for example, a fan shape as a whole. Thereby, the concentration of a current at the ends of the contact portions 51 to 54 is alleviated. The planar shape of each of the contact portions 51 to 54 is not limited to the fan shape and may be another shape as long as the concentration of a current at the ends of the contact portions 51 to 54 can be alleviated. Meanwhile, the outer region mentioned herein refers to the outer circumference of each of the contact portions 51 to 54, and indicates a region facing the outer circumference of the magnetosensitive portion 20. On the other hand, the inner region indicates a region on the central side of the magnetosensitive portion 20 other than the outer region. In a case where the entire region surrounded by the four contact portions 51 to 54 is included in the magnetosensitive portion 20, the amount of current flowing to the ends of the contact portions 51 to 54 is particularly increased, and thus a remarkable effect of alleviating the concentration of a current is obtained.

Here, the sizes of the electrode portions 31 to 34 are determined as follows.

Figure 2A:
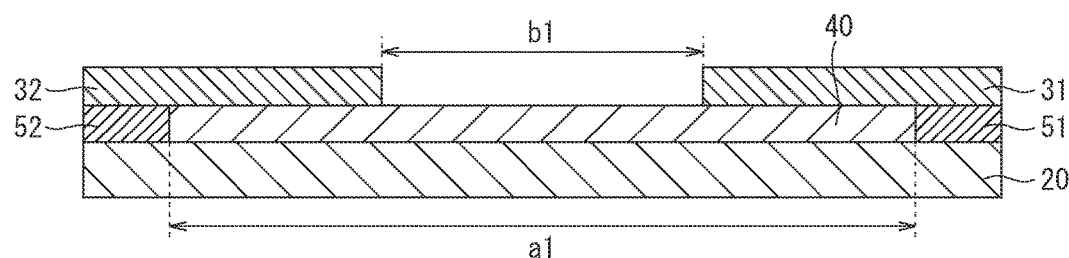
FIG. 2A is a schematic cross-sectional view taken along line A-A' of FIG. 1A for illustrating a positional relationship between portions.
Figure 2B:
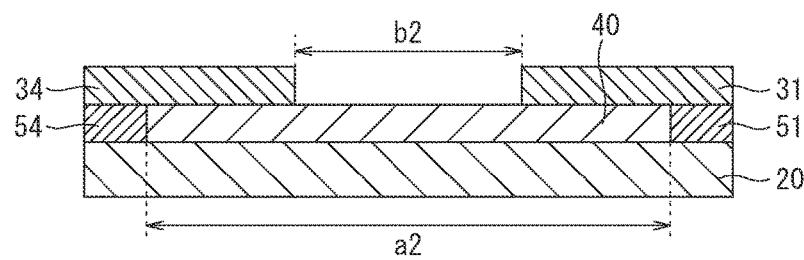
FIG. 2B is a schematic cross-sectional view taken along line C-C' of FIG. 1A for illustrating a positional relationship between portions.

FIG. 2A is a simplified cross-sectional view taken along line A-A' in the hall element 100 illustrated in FIG. 1A. FIG. 2B is a simplified cross-sectional view taken along line C-C' in the hall element 100 illustrated in FIG. 1A.

As illustrated in FIG. 2A, a minimum distance between points on two respective contact portions, for example, the contact portion 51 and the contact portion 52 positioned on a diagonal line of substantially a square shape having the contact portions 51 to 54 as vertexes is set to be a1. In addition, a minimum distance between points on the electrode portion 31 and the electrode portion 32 electrically connected to the contact portion 51 and contact portion 52, respectively, is set to be b1.

Similarly, as illustrated in FIG. 2B, a minimum distance between points on two respective adjacent contact portions, for example, the contact portion 51 and the contact portion 54 of substantially a square shape having the contact portions 51 to 54 as vertexes is set to be a2. In addition, a minimum distance between points on the electrode portion 31 and the electrode portion 34 electrically connected to the contact portion 51 and contact portion 54, respectively, is set to be b2.

The electrode portions 31 to 34 are determined so that the distances a1, a2, b1, and b2 illustrated in FIGS. 2A and 2B satisfy a ratio (first ratio) r1 between conductive portions and a ratio (second ratio) r2 between conductive portions which are represented by the following expression (1) and the following expression (2).

$$r1=(a1-b1)/(a1)$$

$$r1 \leq 75\% \qquad (1)$$

$$r2=(a2-b2)/(a2)$$

$$r2 \leq 75\% \qquad (2)$$

Regarding the value of 75% in Expression (1) and the value of 75% in Expression (2), r1 is preferably equal to or less than 60%, and r2 is preferably equal to or less than 60%. Upper limits of r1 and r2 are set on the basis of, for example, a range in which the influence of parasitic capacitance is reduced or a range in which sufficient dielectric breakdown voltage between adjacent electrode portions is obtained.

In addition, the lower limits are determined so as to satisfy the first ratio r1 of equal to or higher than 13% and the second ratio r2 of equal to or higher than 5%. Lower limits of r1 and r2 are set on the basis of a range in which wire bonding can be performed.

That is, the ratios r1 and r2 between the conductive portions indicate the proportion of regions, extending with the corresponding contact portions 51 to 54 as reference points, of the electrode portions 31 to 34 within the region surrounded by the contact portions 51 to 54 of the magnetosensitive portion 20. That is, r1 indicates the proportion of the electrode portions extending on the magnetosensitive portion 20 with respect to the magnetosensitive portion 20 in a diagonal direction of a quadrangle formed by the region surrounded by the contact portions 51 to 54 in the magnetosensitive portion 20. In addition, r2 indicates the proportion of the electrode portions extending on the magnetosensitive portion 20 with respect to the magnetosensitive portion 20 in a side direction of the quadrangle.

Here, there is a possibility that parasitic capacitance is generated in a stacked structure of the magnetosensitive portion 20, the insulating film 40, and the electrode portions 31 to 34. In addition, as the length of each of the regions of the electrode portions 31 to 34 which extend with the corresponding contact portions 51 to 54 as reference points increases, a potential difference applied to the insulating film 40 becomes larger, and thus dielectric breakdown easily occurs and a leakage current is easily generated. That is, for example, in FIG. 2A, the electrode portion 32 has the same potential regardless of its position. On the other hand, the electrode portion 32, the contact portion 52, and the magnetosensitive portion 20 have the same potential in the stacked portion thereof. However, in the magnetosensitive portion 20 constituted of a compound semiconductor, a voltage to be applied to the magnetosensitive portion 20 becomes lower as a distance from the contact portion 52 increases, due to a voltage drop.

For this reason, in the stacked portion of the electrode portion 32, the insulating film 40, and the magnetosensitive portion 20, a potential difference between the electrode portion 32 and the magnetosensitive portion 20 is small in a region of the magnetosensitive portion 20 which is close to the contact portion 52, but the potential difference between the electrode portion 32 and the magnetosensitive portion 20 becomes larger as a distance from the contact portion 52 increases, and thus dielectric breakdown easily occurs and a leakage current is easily generated. For this reason, it is preferable that the length of the region of the electrode portion 32 which extends with the contact portion 52 as a reference point is short. However, when the length of the region of the electrode portion 32 which extends with the contact portion 52 as a reference point is excessively short, it is difficult to electrically connect a bonding wire or the like for external connection to the electrode portion 32.

In the hall element 100 according to the embodiment of the invention, the ratios r1 and r2 between the conductive portions are set to be equal to or less than 75%, and the proportion of the stacked structure in which parasitic capacitance is generated within the region of the magnetosensitive portion 20 which is surrounded by the contact portions 51 to 54 is limited. That is, the length of each of the regions of the electrode portions 31 to 34 which extend with the corresponding contact portions 51 to 54 as reference points is limited so that a potential difference occurring between the electrode portion 32 and the magnetosensitive portion 20 is set to such an extent as not to cause dielectric breakdown.

For this reason, it is possible to reduce parasitic capacitance generated in the hall element 100, to prevent dielectric breakdown, and to suppress a leakage current. As a result, it is possible to suppress variations in a hall output voltage of the hall element 100, and the like.

Meanwhile, the planar shape of each of the contact portions 51 to 54 is set to at least have such a size that the magnetosensitive portion 20 and each of the corresponding electrode portions 31 to 34 can be electrically connected to each other. In addition, the planar shape of each of the electrode portions 31 to 34 is set at least to have such a size as to be electrically connected to each of the corresponding contact portions 51 to 54 and to be capable of electrically connecting a connection member for external connection such as a bonding wire.

Meanwhile, the ratios r1 and r2 between the conductive portions, for example, a1, a2, b1, and b2 can be measured by visually observing and measuring the hall element 100 from above using an optical microscope, a scanning electron microscope (SEM), or the like, or by observing and measuring the cross-section of the hall element 100 which includes the substrate 10, the magnetosensitive portion 20, the electrode portions, the insulating film 40, and the contact portions, for example, the cross-section taken along line A-A' of FIG. 1A using an SEM, and can be calculated from Expression (1) or Expression (2).

Further, in a case where a plurality of values of r1 or r2 are calculated for one hall element 100, the maximum value for each of r1 and r2 is set to be r1 or r2 in the hall element.

In addition, $b1/b2$ is preferably $1 \leq b1/b2 \leq 3$, and more preferably $1.4 \leq b1/b2 \leq 2.5$. The value of $b1/b2$ is set to be within the range, and thus insulation resistance between the electrode portions is improved, which leads to a preferable effect.

The value of $b1/b2$ is a value indicating a balance between a potential difference between the end of the electrode portion and the substrate, which are present in a diagonal direction of the quadrangle formed by the region surrounded by the contact portions 51 to 54, and a potential difference between the end of the electrode portion and the substrate which are present in the same side direction so as to be adjacent to the region. When the value of $b1/b2$ is within the range, an electric field hardly concentrates between the electrode portions in an in-plane direction of the magnetosensitive portion 20, and thus insulation resistance between the electrode portions is improved, which leads to a preferable effect.

Figure 3A:
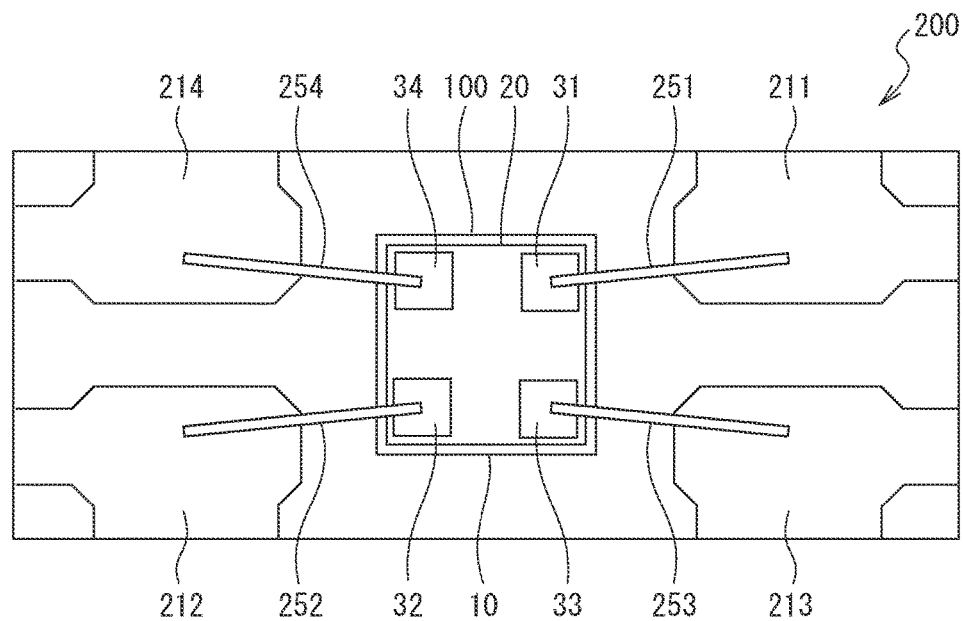
FIG. 3A is a top view illustrating an example of a hall sensor.
Figure 3B:
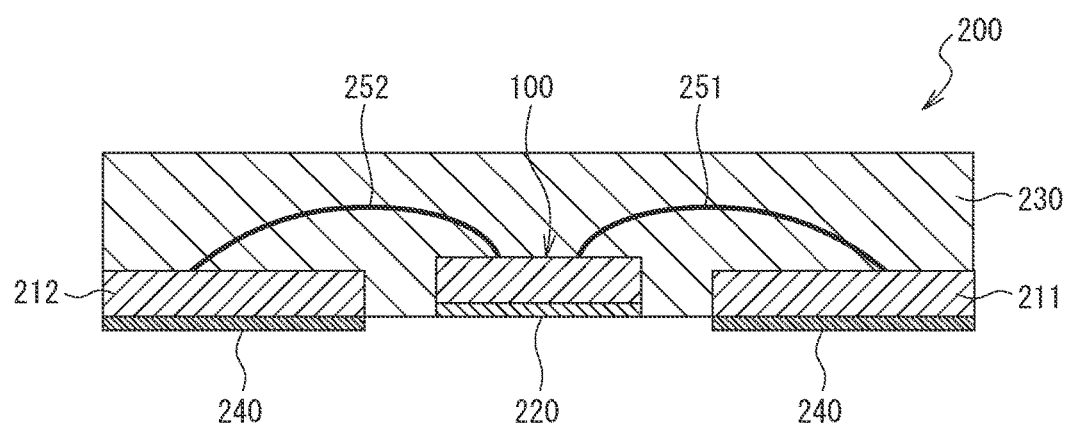
FIG. 3B is a schematic diagram illustrating an example of the cross-section of the hall sensor.

FIG. 3A is a top view illustrating an example of a hall sensor 200 using the hall element 100 according to the embodiment of the invention. FIG. 3B is a schematic diagram illustrating an example of the cross-section of the hall sensor 200.

The hall sensor 200 includes the hall element 100, lead terminals 211 to 214, a protection layer 220, a mold member 230, an external plated layer 240, and bonding wires 251 to 254. Meanwhile, the configuration of the hall sensor 200 is an example, and is not limited thereto.

The hall element 100 is connected to the lead terminals 211 to 214 through the bonding wires 251 to 254. The electrode portion 31 is electrically connected to the lead terminal 211 through the bonding wire 251. The electrode portion 32 is electrically connected to the lead terminal 212 through the bonding wire 252. The electrode portion 33 is electrically connected to the lead terminal 213 through the bonding wire 253. The electrode portion 34 is electrically connected to the lead terminal 214 through the bonding wire 254.

The bonding wires 251 to 254 are formed of a conductive material. For example, a gold wire can be applied as the bonding wires 251 to 254, but the invention is not limited thereto. The bonding wires 251 to 254 are covered with the mold member 230. Thereby, the bonding wires 251 to 254 are fixed.

Meanwhile, a ball portion may be provided between the electrode portions 31 to 34 and each of the bonding wires 251 to 254. The ball portion is formed of a conductive material. The ball portion may be formed of the same material as those of the bonding wires 251 to 254. The ball portion is, for example, a gold ball or a solder ball. In an example, the ball portion has a diameter equal to or greater than 10 μm and equal to or less than 100 μm, for example, a diameter of 60 μm when seen in a top view. Meanwhile, in a case where the ball portion is not a perfect circle when seen in a top view, the ball portion is close to an oval having the same area as that of the ball portion when seen in a top view, and the major axis of the oval may be set to be a diameter. In addition, the thickness of the ball portion is preferably equal to or greater than 5 μm from a viewpoint of alleviating stress. In addition, the thickness of the ball portion is preferably equal to or less than 100 μm from a viewpoint of facilitating manufacture. Meanwhile, the thickness of the ball portion means a distance between the highest portion of the ball portion and each of the electrode portions 31 to 34 in which the ball portion is disposed.

Here, when a transmission view of a cross-section obtained by roentgenography of the hall sensor 200 is observed, a portion having a width larger than the thickness of the bonding wire may be defined as a ball portion in a case where the bonding wire 252 is followed from the lead terminal 212 side to the hall element 100 side.

The lead terminals 211 to 214 are electrically connected to the outside through the external plated layer 240. In the lead terminals 211 to 214, the external plated layer 240 is formed on a surface opposite to a surface connected to each of the bonding wires 251 to 254. Thereby, the hall element 100 is electrically connected to the outside of the hall sensor 200. Meanwhile, the external plated layer 240 is formed of, for example, tin (Sn), but is not limited thereto.

The protection layer 220 covers a surface opposite to a surface connected to each of the bonding wires 251 to 254 of the hall element 100. The material of the protection layer 220 is not limited as long as the material can protect, for example, the substrate 10. The protection layer 220 may be a film constituted of any one of a conductor, an insulator, or a semiconductor, or may be a film including two or more thereof. In a case of the conductor, the protection layer 220 may be a conductive resin such as silver paste. In a case of the insulator, the protection layer 220 may be an insulating paste containing an epoxy-based thermosetting resin and silica ($SiO_2$), a silicon nitride, a silicon dioxide, or the like. In a case of the semiconductor, the protection layer 220 may be formed by bonding a Si substrate or a Ge substrate.

The mold member 230 molds the hall element 100, the bonding wires 251 to 254, and the lead terminals 211 to 214. The mold member 230 is formed of a material capable of withstanding intense heat during reflowing. For example, the mold member 230 is formed of an epoxy-based thermosetting resin.

Here, as described above, in a case where a stacked structure of the electrode portions 31 to 34, the insulating film 40, and the magnetosensitive portion 20 is included in the hall element 100, there is a possibility that parasitic capacitance and the like are generated. As illustrated in FIGS. 2A and 2B, the hall element 100 according to the embodiment of the invention sets the electrode portions 31 to 34 to satisfy Expression (1) and Expression (2), and limits the proportion of regions, extending with the corresponding contact portions 51 to 54 as reference points, of the electrode portions 31 to 34 in the region surrounded by the contact portions 51 to 54 of the magnetosensitive portion 20. For this reason, it is possible to suppress the generation of parasitic capacitance, a leakage current, and the like and to suppress fluctuations in output characteristics of the hall element 100. In addition, a potential difference applied to the insulating film can be reduced, and thus it is possible to improve a dielectric breakdown voltage.

In addition, as described above, the hall element 100 can alleviate the concentration of a current on the magnetosensitive portion 20. Thereby, a minute resistance fluctuation caused by the concentration of a current on the magnetosensitive portion 20 hardly occurs. Therefore, the hall element 100 can suppress 1/f noise generated due to the concentration of a current.

Manufacturing Method

FIGS. 4A to 4G are cross-sectional views illustrating an example of a process of manufacturing the hall element 100. Meanwhile, a method of manufacturing the hall element 100 is not limited thereto. Meanwhile, here, a description is given on the assumption that the contact portions 51 to 54 are contact portions 50.

First, target values of the ratios r1 and r2 between conductive portions which are represented by Expression (1) and Expression (2) are determined. As the ratios r1 and r2 between conductive portions increase, there is a higher tendency for parasitic capacitance and a leakage current to be generated. Accordingly, the ratios r1 and r2 between conductive portions are determined in accordance with the size of the hall element 100, the positions where the contact portions 51 to 54 are disposed, and the like. The positions where the contact portions 51 to 54 are disposed are determined on the basis of the determined ratios r1 and r2 between conductive portions, the size of the hall element 100, and the like.

Subsequently, the distance b1 and b2 between electrode portions are determined from the determined ratios r1 and r2 between conductive portions and the distances a1 and a2 between contact portions which are obtained from the positions where the contact portions 51 to 54 are disposed.

The contact portions 51 to 54 and the electrode portions 31 to 34 are formed so as to satisfy the distances a1, a2, b1, and b2.

First, a large-sized substrate which is divided into a plurality of pieces to serve as the substrate 10 is prepared. The planar shape of the substrate 10 divided into individual pieces is, for example, substantially a square shape.

Figure 4A:
FIG. 4A is an example of a cross-sectional view illustrating a process of manufacturing the hall element.
Figure 4B:
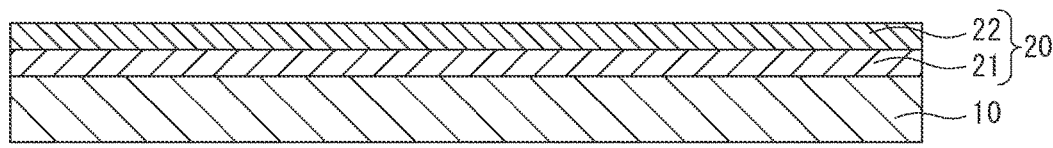
FIG. 4B is an example of a cross-sectional view illustrating a process of manufacturing the hall element.

Next, the magnetosensitive portion 20 is formed on the substrate 10 (FIG. 4B). Specifically, the conductive layer 21 is formed on the substrate 10, and the surface layer 22 is formed on the conductive layer 21. In a film forming step of the magnetosensitive portion 20, the planar shape of each of the conductive layer 21 and the surface layer 22 may be the same as the planar shape of the substrate 10. For example, the magnetosensitive portion 20 is formed by epitaxially growing a compound semiconductor on the substrate 10 by using a Metal Organic Chemical Vapor Deposition (MOCVD) method or a molecular beam epitaxy (MBE) method.

Figure 4C:
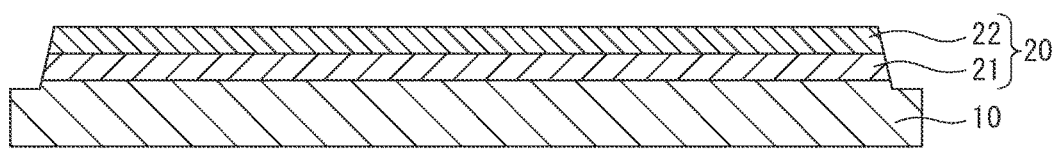
FIG. 4C is an example of a cross-sectional view illustrating a process of manufacturing the hall element.
Figure 4D:
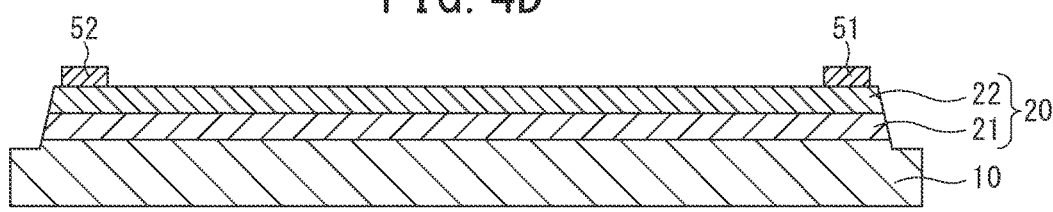
FIG. 4D is an example of a cross-sectional view illustrating a process of manufacturing the hall element.

Next, in FIG. 4C, the magnetosensitive portion 20 is etched to a pattern of a planar shape which is determined in advance. Thereby, the magnetosensitive portion 20 is formed to have, for example, substantially a square planar shape. In addition, the corner portion of the planar shape of the magnetosensitive portion 20 may be rounded by the etching process. Next, in FIG. 4D, the contact portion 50 is formed on the magnetosensitive portion 20. The contact portion 50 is formed using any semiconductor manufacturing process such as deposition and sputtering. The contact portion 50 is formed in the vicinity of the corner portion of the magnetosensitive portion 20.

Figure 4E:
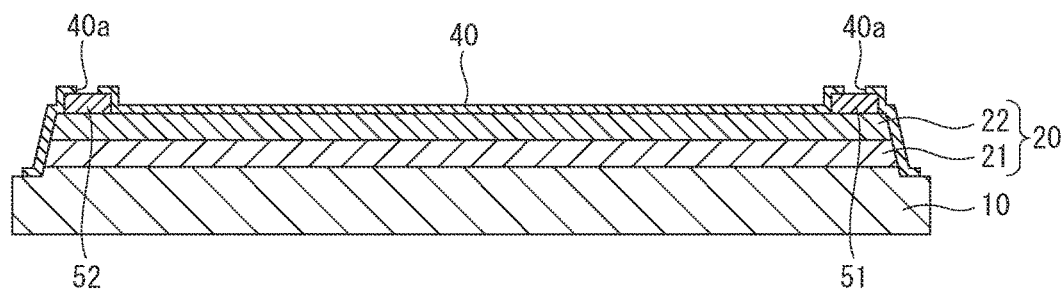
FIG. 4E is an example of a cross-sectional view illustrating a process of manufacturing the hall element.

Next, in FIG. 4E, the insulating film 40 is formed on the substrate 10, the magnetosensitive portion 20, and the contact portion 50. For example, a SiN film having a thickness of 300 nm is formed as the insulating film 40. In addition, the opening 40a for electrically connecting the contact portion 50 and the electrode portions 31 to 34 to each other is formed in the insulating film 40. The opening 40a may be formed by an etching process.

Figure 4F:
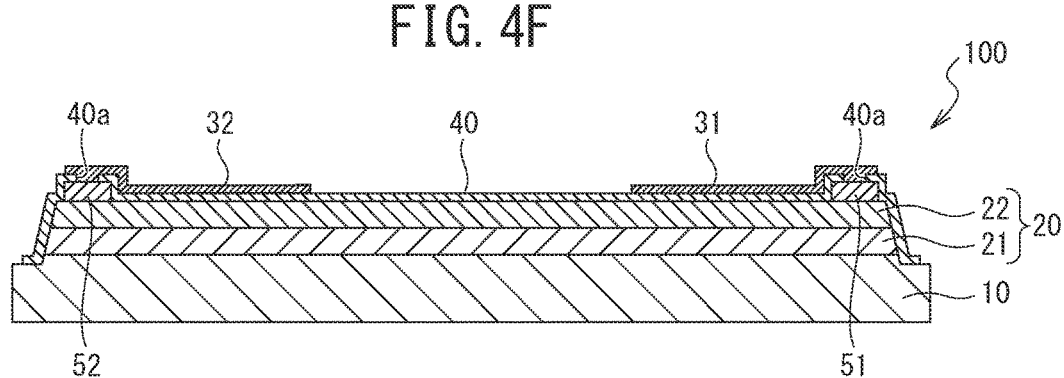
FIG. 4F is an example of a cross-sectional view illustrating a process of manufacturing the hall element.

Next, in FIG. 4F, the electrode portions 31 to 34 are formed on the insulating film 40. In addition, the electrode portions 31 to 34 are electrically connected to the contact portion 50 through the opening 40a formed in the insulating film 40. In an example, the thickness of each of the electrode portions 31 to 34 is 0.5 μm, but is not limited thereto. Thereby, the hall element 100 is formed.

Meanwhile, here, a step of forming the contact portions 51 to 54 is performed before a step of forming the insulating film 40, but a step of forming the contact portions 51 to 54 may be performed after a step of forming the insulating film 40.

In the embodiment, a description has been given of a case where each of a distance between two sets of contact portions positioned on a diagonal line and a distance between two adjacent sets of contact portions satisfies a target value of a ratio between conductive portions, but a configuration can also be adopted in which only one set or only a plurality of sets satisfy the target value of the ratio between conductive portions.

In the embodiment, a description has been given of a case where the contact portions 51 to 54 are disposed at the corner portions of the magnetosensitive portion 20, but is not limited thereto. The contact portions 51 to 54 may be disposed so as to have any positional relationship with the magnetosensitive portion 20 as long as a magnetosensitive region surrounded by the four contact portions 51 to 54 is disposed to be included within the magnetosensitive portion 20 when seen in a top view.

While the embodiment of the invention has been described, the embodiment is illustrative of a device and a method for embodying the technical idea of the invention. The technical idea of the invention does not specify materials, shapes, structures, arrangement, and the like of components. Various modifications can be made to the technical idea of the invention within the technical scope specified by claims.

DESCRIPTION OF REFERENCE NUMERALS

10: substrate
20: magnetosensitive portion
21: conductive layer
22: surface layer
31 to 34: electrode portion
40: insulating film
51 to 54: contact portion
100: hall element
200: hall sensor
211 to 214: lead terminal
251 to 254: bonding wire
230: mold member

What is claimed is:
1. A hall element comprising:
a substrate;
a magnetosensitive portion formed on the substrate;
an insulating film configured formed on the magnetosensitive portion; and
four conductive portions,
wherein each of the conductive portions includes an electrode portion formed on the insulating film to extend in a direction in which the conductive portions are close to each other, and a contact portion that electrically connects the electrode portion and the magnetosensitive portion to each other through the insulating film,
wherein an entire region surrounded by the four contact portions is included in the magnetosensitive portion, and
wherein ratios r1 and r2 defined by the following expressions are both equal to or less than 75% in each of a pair of the conductive portions positioned on a diagonal line of a quadrangle formed by the four contact portions and a pair of adjacent the conductive portions on a side of the quadrangle,

$$r1=(a1-b1)/a1$$

$$r2=(a2-b2)/a2$$

a1: a distance between the contact portions positioned on the diagonal line of the quadrangle
b1: a distance between the electrode portions positioned on the diagonal line of the quadrangle
a2: a distance between the adjacent contact portions on the side of the quadrangle
b2: a distance between the adjacent electrode portions positioned on the side of the quadrangle.

2. The hall element according to claim 1, wherein the first ratio r1 is equal to or higher than 13%, and the second ratio r2 is equal to or higher than 5%.

3. The hall element according to claim 1, wherein the first ratio r1 is equal to or less than 60%, and the second ratio r2 is equal to or less than 60%.

4. A method of manufacturing a hall element including a substrate, a magnetosensitive portion formed on the substrate, an insulating film formed on the magnetosensitive portion, and four conductive portions disposed on the insulating film at positions serving as corner portions of a quadrangle and electrically connected to the magnetosensitive portion through the insulating film, each of the conductive portions including an electrode portion formed on the insulating film to extend in a direction in which the conductive portions approach each other, and a contact portion that electrically connects the electrode portion and the magnetosensitive portion to each other through the insulating film, a region of the quadrangle with the four conductive portions as the corner portions being included in a region of the magnetosensitive portion when seen in a top view, the method comprising:
determining a target value of a ratio between the conductive portions for making variations in characteristics of the hall element equal to or less than the target value, with proportions of a distance between points for minimizing a distance between the contact portions included in a conductive portion pair, including two of the four conductive portions, and a distance between points for minimizing a distance between the electrode portions included in the conductive portion pair, as the ratio between the conductive portions;
determining a shape of the magnetosensitive portion;
determining positions where the contact portions are disposed, and shapes of the contact portions; and determining positions where the electrode portions are disposed, and shapes of the electrode portions to satisfy the target value of the ratios between the conductive portions, on the basis of the positions where the contact portions are disposed, and the shapes of the contact portions.

5. The method of manufacturing a hall element according to claim 4,
wherein the ratio between the conductive portions includes a first ratio r1 and a second ratio r2 which are defined by the following expressions, and
wherein the first ratio r1 is equal to or less than 75%, and the second ratio r2 is equal to or less than 75%, $$r1=(a1-b1)/a1$$

$$r2=(a2-b2)/a2$$

a1 is a distance between points for minimizing the distance between the contact portions, among the four conductive portions, which are included in the conductive portion pair positioned on the diagonal line,
b1 is a distance between points for minimizing the distance between the electrode portions included in the conductive portion pair positioned on the diagonal line,
a2 is a distance between points for minimizing the distance between the contact portions included in the adjacent conductive portion pairs among the four conductive portions, and
b2 is a distance between points for minimizing the distance between the electrode portions included in the adjacent conductive portion pairs.

6. The hall element according to claim 2,
wherein the first ratio r1 is equal to or less than 60%, and the second ratio r2 is equal to or less than 60%.

* * * * *